(12) United States Patent
Cliquennois

(10) Patent No.: US 11,525,851 B2
(45) Date of Patent: Dec. 13, 2022

(54) CAPACITIVE STRUCTURE

(71) Applicant: STMicroelectronics (Grenoble 2) SAS, Grenoble (FR)

(72) Inventor: Sebastien Cliquennois, La Buisse (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 265 days.

(21) Appl. No.: 16/897,777

(22) Filed: Jun. 10, 2020

(65) Prior Publication Data

US 2020/0393503 A1 Dec. 17, 2020

(30) Foreign Application Priority Data

Jun. 17, 2019 (FR) ...................................... 1906456

(51) Int. Cl.
| | | |
|---|---|---|
| *G01R 27/06* | (2006.01) | |
| *G01R 27/26* | (2006.01) | |
| *H01L 23/522* | (2006.01) | |

(52) U.S. Cl.
CPC ...... *G01R 27/2605* (2013.01); *H01L 23/5223* (2013.01)

(58) Field of Classification Search
None
See application file for complete search history.

(56) References Cited

U.S. PATENT DOCUMENTS

| | | | |
|---|---|---|---|
| 6,670,692 B1 * | 12/2003 | Shih | ............ H01L 23/5223 257/532 |
| 2003/0148578 A1 | 8/2003 | Ku et al. | |
| 2004/0002187 A1 * | 1/2004 | Block | ............ H01L 28/87 257/E27.048 |
| 2005/0167702 A1 | 8/2005 | Booth et al. | |
| 2009/0194845 A1 * | 8/2009 | Werner | ............ H01L 27/10852 257/532 |
| 2019/0006458 A1 * | 1/2019 | Chan | ............ H01L 27/0805 |
| 2019/0214341 A1 * | 7/2019 | Marzaki | ............ H01L 27/0805 |

OTHER PUBLICATIONS

INPI Search Report and Written Opinion for FR 1906456 dated Jun. 17, 2019 (9 pages).

* cited by examiner

*Primary Examiner* — Tan T. Nguyen
(74) *Attorney, Agent, or Firm* — Crowe & Dunlevy

(57) ABSTRACT

A digital integrated circuit includes first areas of a substrate which incorporate digital functions and second areas of the substrate which are filler between first areas. A capacitance is provided by interdigitated metal-insulator-metal structures formed from a metallization level above the substrate. The structures of the capacitance are vertically aligned with one or more of the second areas.

29 Claims, 3 Drawing Sheets

CAPACITIVE STRUCTURE

PRIORITY CLAIM

This application claims the priority benefit of French Application for Patent No. 1906456, filed on Jun. 17, 2019, the content of which is hereby incorporated by reference in its entirety to the maximum extent allowable by law.

TECHNICAL FIELD

The present disclosure relates generally to electronic devices, and more particularly to digital integrated circuits.

BACKGROUND

Supply voltage drops are often harmful to the operation of components of a digital integrated circuit. To address this problem, most digital integrated circuits include capacitors. Capacitors indeed make it possible, through their discharge in case of voltage drop, to stabilize or smooth the supply voltage of the components of the circuit with which they are associated.

These capacitors are typically located in areas called "filler cells", which are embedded in the middle of digital cells, that is to say, areas of the circuit incorporating digital functions. Such filler cells are then referred to as "filler caps" or "filler capacitors". The higher the electrical capacity of these filler caps is, the more stable the supply voltage remains in case of current draw.

There is a need to increase the electrical capacity of the current filler caps.

There is a need to address all or some of the drawbacks of known filler caps.

SUMMARY

One embodiment provides a digital integrated circuit comprising: first areas incorporating digital functions; and one or several first capacitances, constituted by interdigitated metal-insulator-metal structures, aligned with one or several second areas filling in one or several spaces between the first areas.

One embodiment provides a method for manufacturing a digital integrated circuit, comprising: producing first areas incorporating digital functions; and producing, aligned with one or several second areas filling in one or several spaces between the first areas, one or several first capacitances constituted by interdigitated metal-insulator-metal structures.

According to one embodiment, the first capacitance(s) are associated and aligned with one or several second capacitances constituted by at least one transistor.

According to one embodiment, the second capacitance(s) are constituted by two floating gate transistors.

According to one embodiment, the first capacitance(s) are constituted by: a first electrode having first fingers parallel to one another; a second electrode having second fingers that are parallel to one another and parallel to the first fingers, the second fingers of the second electrode being interdigitated with the first fingers of the first electrode; and an insulator intercalated between the first electrode and the second electrode.

According to one embodiment, the first electrode and the second electrode form a planar structure, parallel to an upper surface of the circuit.

According to one embodiment, all or some of the first fingers and all or some of the second fingers further form an interdigitated structure along a direction not parallel to the first fingers and the second fingers.

According to one embodiment: the first electrode is coupled to a supply potential; and the second electrode is coupled to a reference potential.

According to one embodiment, the first fingers and the second fingers have a width equal to about 70 nm, preferably equal to 70 nm.

According to one embodiment, the first fingers are separated from the second fingers by a distance of between about 70 nm and about 80 nm, preferably between 70 nm and 80 nm.

According to one embodiment, the first capacitance(s) have a length equal to about an integer number of times a minimum center distance between the tracks of the circuit, preferably equal to an integer number of times a minimum center distance between the tracks of the circuit.

One embodiment provides a circuit or a method as described having, on a substrate in which active components are formed, several superimposed metallization layers with interposition of insulating levels, the first capacitance(s) being made in the metallization layer closest to the substrate.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the areas incorporating digital functions are not described in detail, these areas being compatible with the typical applications of digital integrated circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1A:
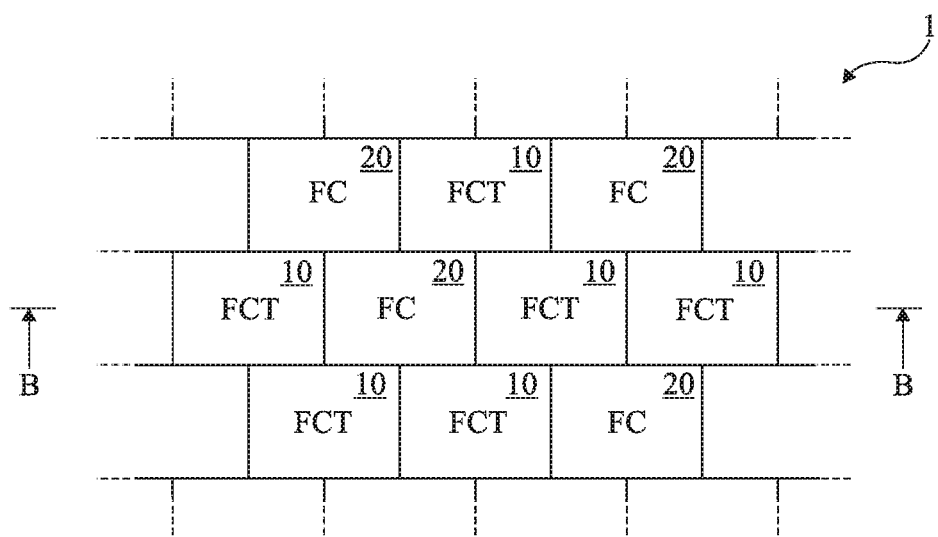
FIGS. 1A-1B show, very schematically by sectional views, an embodiment of a digital integrated circuit.
Figure 1B:
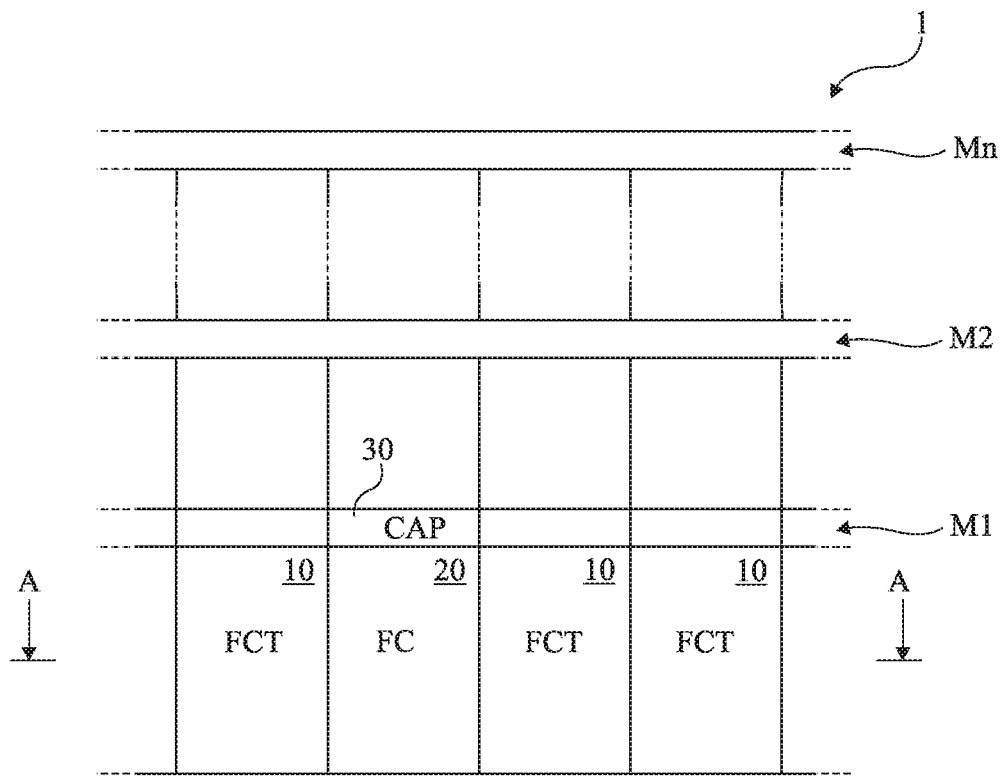

FIGS. 1A-1B show, very schematically by sectional views, an embodiment of a digital integrated circuit 1.

FIG. 1A corresponds to a top and sectional view, along plane AA visible in FIG. 1B, of the digital integrated circuit 1. FIG. 1B corresponds to a side and sectional view, along plane BB visible in FIG. 1A, of the digital integrated circuit 1.

According to this embodiment, the digital integrated circuit 1 includes: first areas 10 (FCT) incorporating circuits for performing digital functions; and second areas 20 (FC) filling in one or several spaces or intervals between the first areas 10.

These first areas 10 and these second areas 20 of the digital circuit 1 are, seen from above, organized in the form of lines or rows.

The first areas 10 include any type of digital circuit, for example, switches, storage elements, etc., as well as logic gates (not shown) making it possible to perform logic functions (AND, OR, NO, exclusive OR (XOR), etc.) that are specific to a given application. These first areas 10 are also called functional cells 10, or standard cells 10.

In the example of FIGS. 1A-1B, the second areas 20 make it possible to fill in spaces between the first non-adjacent areas 10. In other words, the second areas 20 of the circuit 1 do not participate in performing logic functions specific to the application. These second areas 20 are also called filler cells 20.

The digital circuit 1 has a substrate 40 in and on which active components are formed and several superimposed metallization levels M1, M2, Mn with interposition of insulating levels. Certain filler cells, for example, have connection elements (not shown) making it possible to establish an electrical continuity between several metallization levels among the metallization levels M1, M2 and/or Mn (FIG. 1B) of the digital integrated circuit 1. This, for example, makes it possible to convey a supply signal or potential, denoted VDD, and a reference signal or potential, for example the ground, denoted GND, between the different metallization levels M1, M2 and Mn.

Other filler cells include one or several capacitors. These filler cells are then called filler caps. These filler caps make it possible to locally stabilize or smooth the supply voltage of the functional cells 10 of the circuit 1 that are located nearby.

To simplify, it is assumed hereinafter that all of the filler cells 20 of the circuit 1 are filler caps.

According to one preferred embodiment, a first capacitor 30 (CAP, FIG. 1B) is located level with each filler cap 20. This first capacitor 30 is, still according to this preferred embodiment, located in the metallization layer M1 of the circuit 1. The metallization layer M1 is, in the example of FIG. 1B, the metallization layer closest to the substrate 40 of the circuit 1.

Each filler cap 20 preferably has a second capacitance (not shown). This second capacitance is, for example, constituted by one or several transistors integrated inside the second area 20. In other words, the first capacitance 30 is stacked on the filler cap 20.

The first capacitance 30 makes it possible to increase the electrical capacitance of the filler cap 20 by about 20%. The functional cells 10 of the circuit 1 located near the filler caps 20 are thus less affected by supply voltage variations. This, therefore, improves the overall operation of the circuit 1.

For an integrated digital circuit 1 including a large number n of metallization levels (M1 to Mn), for example, from five metallization levels (M1 to M5), the presence of the first capacitances 30 in the level M1 is taken into account at the time of the routing. One then takes advantage of the upper metallization levels (that is to say, M2 to Mn) to perform the routing, which makes it possible to interconnect the first areas 10 and the second areas 20 even if the level M1 is partially occupied by first capacitances 30.

Figure 2:
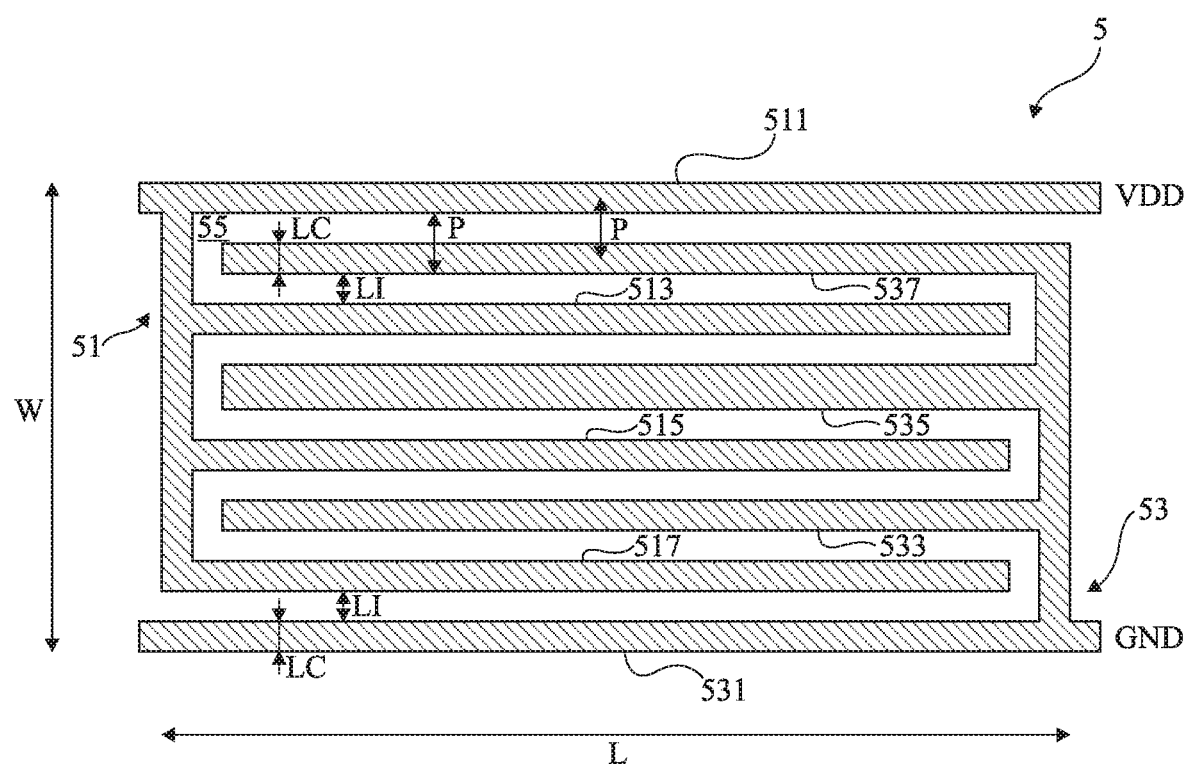
FIG. 2 shows an embodiment of a capacitive structure.

FIG. 2 shows an embodiment of a capacitive structure 5. FIG. 2 is a top view of a metallization layer in which a capacitance 30 is made.

According to the embodiment of FIG. 2, the capacitive structure 5 is made up of a first electrode 51 and a second electrode 53. The first electrode 51 includes first fingers 511, 513, 515 and 517 that are parallel to one another. The second electrode 53 includes second fingers 531, 533, 535 and 537 that are parallel to one another. The second fingers 531, 533, 535 and 537 are further parallel to the first fingers 511, 513, 515 and 517. An insulator 55 is intercalated between the fingers of the first electrode 51 and the fingers of the second electrode 53.

The first fingers 511, 513, 515 and 517 of the first electrode 51 and the second fingers 531, 533, 535 and 537 of the second electrode 53 interpenetrate one another, or in other words, are interleaved in one another. In other words, the capacitive structure 5 forms, seen from above, a double comb of interdigitated electrodes 51 and 53. The insulator 55 thus separates the first fingers 511, 513, 515 and 517 from the second fingers 531, 533, 535 and 537. The insulator 55 thus constitutes the dielectric of the capacitance between the two electrodes 51 and 53.

It is assumed that the capacitive structure 5 constitutes the first capacitance 30 located level with the filler cap 20 as described in relation with FIGS. 1A-1B. The capacitive structure 5 thus corresponds to an embodiment of the first capacitance 30 (FIG. 1B), seen from above in FIG. 2. The first electrode 51 and the second electrode 53 in this case form a planar structure, parallel to an upper surface of the circuit (at the top of the circuit 1, in FIG. 1).

One then ensures that the capacitive structure 5 has suitable dimensions based on the filler cap (20, in FIGS. 1A-1B) with which it is associated. The capacitive structure 5 preferably has a length, denoted L, and a width, denoted W, such that the capacitive structure 5 completely covers an upper surface (not shown) of the associated filler cap. In other words, the dimensions of the capacitive structure 5 correspond to the lateral and longitudinal dimensions of the filler cap that is associated with it.

Reference P denotes a minimum center distance between the metal tracks of the circuit 1 (FIGS. 1A-1B). The distance P is called "pitch" of the circuit 1. The pitch P corresponds approximately, in FIG. 2, to a minimum center distance between two adjacent fingers. This pitch P can also be expressed as being, in the used technology, the sum of the minimum width of a metal track and the minimum gap between two tracks (or the sum of the minimum width of a finger and the minimum gap between two adjacent fingers, in the example of FIG. 2). The length L of the capacitive structure 5, measured along a direction parallel to the fingers, is approximately equal, preferably equal, to an integer number of times the pitch P of the circuit.

The width W of the capacitive structure 5, measured along a direction perpendicular to the fingers, is approximately equal, preferably equal, to a line or row height formed by the first areas 10 and the second areas 20, as illustrated in relation with FIGS. 1A-1B.

The capacitive structure 5 preferably has a thickness equal to the thickness of the metallization layer in which it is made (the metallization layer M1, in the case of the first capacitance 30 shown in FIGS. 1A-1B).

According to one embodiment, the first fingers 511, 513, 515 and 517 and the second fingers 531, 533, 535 and 537 have an identical with, denoted LC. For a circuit made owing to a 40 nm etching technology, the first fingers 511, 513, 515 and 517 and the second fingers 531, 533, 535 and 537 have a width equal to about 70 nm, preferably equal to 70 nm.

According to one embodiment, certain first and/or second fingers have a width greater than the width of the other fingers. This, for example, makes it possible to connect the capacitive structure 5 to contacts of the filler cap 20 located level with the structure 5. This also, for example, makes it possible to return to a total number of first and second fingers that is an even number, therefore to maximize the electrical capacity of the structure 5.

According to one embodiment, the first fingers 511, 513, 515 and 517 are separated from the second fingers 531, 533, 535 and 537 by a distance, denoted LI, of between about 70 nm and about 80 nm, preferably between 70 nm and 80 nm. In other words, the insulator 55 forms, between the first electrode 51 and the second electrode 53, an area with a width LI.

In order to optimize the electrical capacity of the capacitive structure 5, one ensures that the interdigitated electrodes 51 and 53 include a maximum number of first and second fingers. Preferably, the capacitive structure 5 is thus made so that: the first and second fingers all have the smallest possible with LC; and the distance LI between two adjacent fingers as small as possible while taking into account, if applicable, integration constraints (coming, for example, from contacts intended to connect the structure 5 to the filler cap 20).

One also maximizes the electrical capacity of the capacitive structure 5 by ensuring that the first and second fingers are as long as possible.

In other words, one ensures that: the interdigitated combs formed by the two electrodes 51 and 53 include a maximum of first and second fingers; and the width LI of the insulator 55 separating the two electrodes 51 and 55 is as small as possible.

According to one embodiment, the width of one or several fingers, among the first fingers 511, 513, 515 and 517 and the second fingers 531, 533, 535 and 537, is greater than that of the other fingers. The finger 535 has, in the example of FIG. 2, a width slightly greater than that of the other fingers. This makes it possible to optimize the electrical capacity of the capacitive structure 5 as a function of the available width W.

In FIG. 2, the first electrode 51 is coupled to the supply potential VDD of the circuit, while the second electrode 53 is grounded GND. In a variant, the first electrode 51 is grounded GND while the second electrode 53 is coupled to the supply potential VDD of the circuit. The fingers 511 and 531 form, in FIG. 2, supply rails made in the metallization layer M1. In other words, the fingers 511 and 531 both extend laterally (that is to say, to the right and to the left, in FIG. 2) in order to connect other adjacent cells.

The electrodes 51 and 53 are, for example, made by etching of the metallization layer M1 of the circuit 1 (FIGS. 1A-1B). The electrodes 51 and 53 then form, jointly with the insulator 55, an interdigitated metal-insulator-metal (MIM) structure. In the case where the insulator is an oxide, for example a silicon oxide, the capacitive structure 5 is said to be an interdigitated metal-oxide-metal (MOM) structure.

Figure 3:
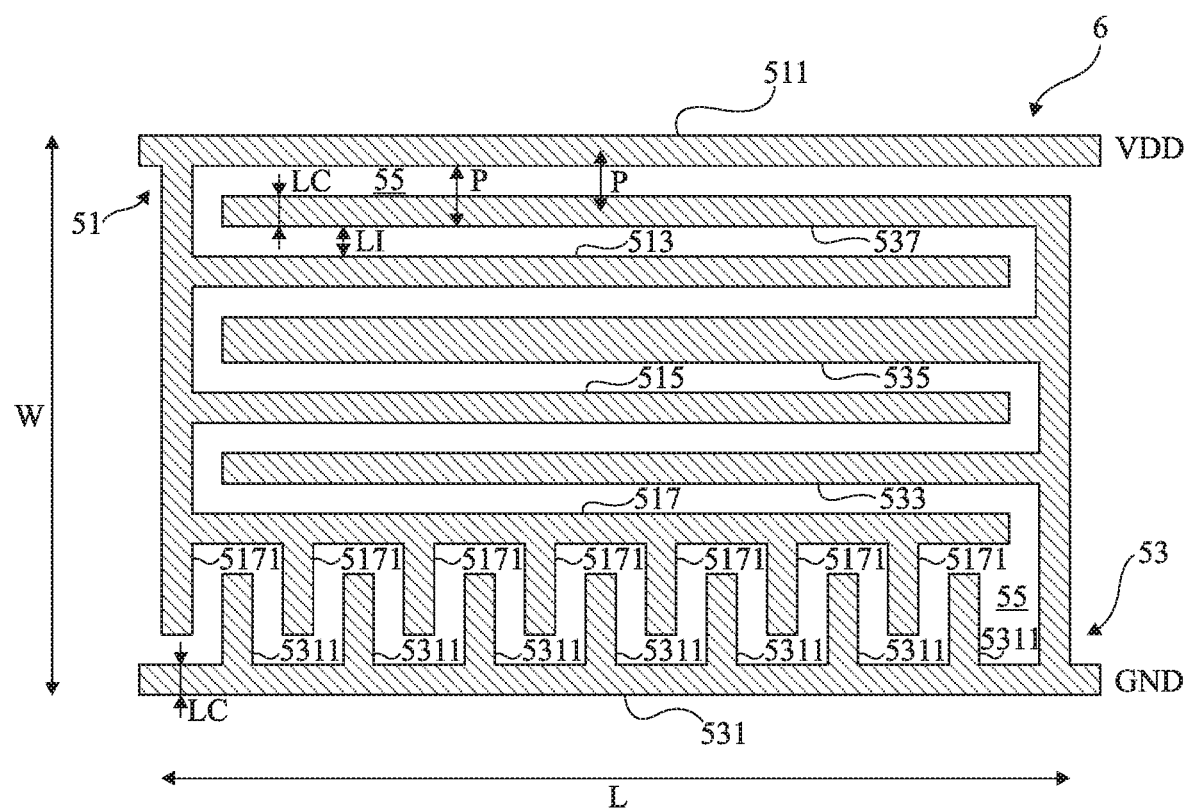
FIG. 3 shows another embodiment of a capacitive structure.

FIG. 3 shows another embodiment of a capacitive structure 6.

The capacitive structure 6 of FIG. 3 comprises like elements with the capacitive structure 5 of FIG. 2. These like elements will not be described in detail again hereinafter.

The capacitive structure 6 of FIG. 3 differs from the capacitive structure 5 of FIG. 2 primarily in that one of the first fingers (the first finger 517, in FIG. 3) and one of the second fingers (the second finger 531, in FIG. 3) further form an interdigitated structure along a direction not parallel to the first fingers and the second fingers, preferably along a direction perpendicular to the first fingers and the second fingers. According to the embodiment of FIG. 3, the first finger 517 has fingers 5171 that are parallel to one another. Likewise, the second finger 531 has fingers 5311 that are parallel to one another and parallel to the fingers 5171. The fingers 5171 and 5311 are, in FIG. 3, perpendicular to the first fingers 511, 513, 515 and 517 and the second fingers 531, 533, 535 and 537.

The fingers 5171 of the first electrode 51 and the second fingers 5311 of the second electrode 53 interpenetrate one another, or in other words, are interleaved in one another. In other words, the capacitive structure 5 forms, seen from above, a double comb of interdigitated electrodes 51 and 53 along two perpendicular directions.

It is assumed that the width W of the capacitive structure is not equal to $n*(LI+LC)+LC$, where n is an integer. Instead of increasing the width LC of certain first or second fingers, the interdigitated structure formed by the fingers 5171 and 5311 then makes it possible to still further optimize the electrical capacity of the structure 6 by taking advantage of the remaining available space.

Figure 4:
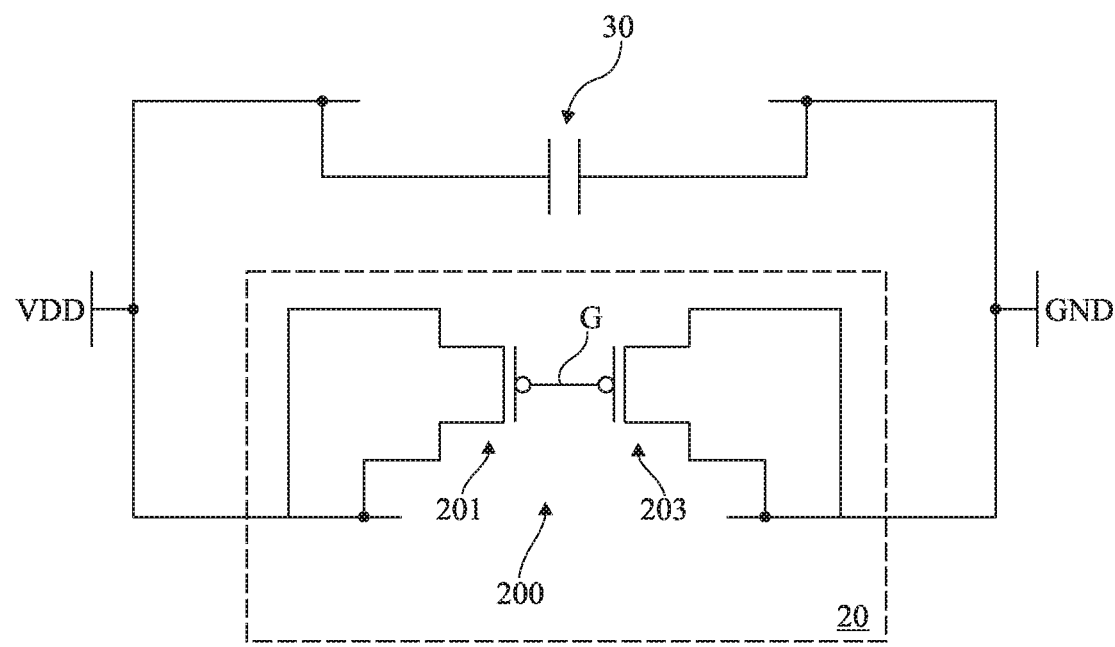
FIG. 4 schematically shows an embodiment of a filler cap.

FIG. 4 schematically shows an embodiment of a filler cap.

According to this embodiment, a filler cap, for example, the filler cap 20 as disclosed in relation with FIG. 1, is made up of two transistors 201 and 203. The two transistors 201 and 203 are, for example, two MOS transistors. In the example of FIG. 4, the transistor 201 is a P channel MOS transistor while the transistor 203 is a N channel MOS transistor. The two transistors 201 and 203 have, still in the example of FIG. 4, a common gate G. The gate G of the MOS transistors 201 and 203 not being coupled to any terminal for applying a control signal, it is said that the gate G is a floating gate.

The two transistors 201 and 203 of the filler cap 20 jointly form a second capacitance 200. This second capacitance 200 is preferably associated in parallel with the first capacitance 30 topping the filler cap 20. Conductors, or conductive tracks, respectively conveying the supply signal VDD and the reference signal GND are thus coupled by the first capacitance 30 and by the second capacitance 200, mounted in parallel with the capacitance 30.

One thus increases, owing to the first capacitance 30, an electrical capacity of the filler cell 20 relative to that of a filler cell 20 that would only include the second capacitance 200. This makes it possible to better stabilize or smooth the supply voltage of components (not shown) coupled or connected between the conductors brought to the potentials VDD and GND.

What has been disclosed above in relation with one embodiment using the example of two floating gate MOS transistors is, however, not limiting and also applies to a filler cap 20 having one or several capacitances using any technology, in particular transistors with any technology (p-type MOS, n-type MOS, parallel association of a p-type MOS and an n-type MOS, etc.).

Various embodiments and variants have been described. Those skilled in the art will understand that certain features of these embodiments can be combined and other variants will readily occur to those skilled in the art. In particular, the described embodiments mention a filler cap 20 associated with a single first capacitance 30 and having a single second capacitance 200, but all or some of the filler caps 20 of the circuit 1 can have any number of second capacitances 200 and/or be associated with any number of first capacitances 30.

Finally, the practical implementation of the embodiments and variants described herein is within the capabilities of those skilled in the art based on the functional description provided hereinabove.

The invention claimed is:

1. A digital integrated circuit, comprising:
a substrate;
first circuit cell areas of the substrate, wherein each first circuit cell area includes integrated circuitry for performing digital functions; and
second filler cell areas of the substrate located to fill space between first circuit cell areas, wherein each second filler cell area includes solely integrated circuitry for providing a filler capacitor;
a metallization level over said substrate, wherein the metallization level includes a further capacitor formed by an interdigitated metal-insulator-metal structure that is electrically coupled to said filler capacitor, said further capacitor aligned over at least one of said second filler cell areas and configured to increase a capacitance of the filler capacitor.

2. The circuit of claim 1, wherein said filler capacitor is formed by a capacitance constituted by at least one transistor integrated in the second filler cell area.

3. The circuit of claim 2, wherein said capacitance of said at least one transistor is a gate capacitance.

4. The circuit of claim 3, wherein the gate capacitance is a floating gate capacitance provided by said at least one transistor and a further transistor having gate terminals directly electrically connected to each other.

5. The circuit of claim 4, wherein said further transistor is also located within said second filler cell area.

6. The circuit of claim 1, wherein the interdigitated metal-insulator-metal structure comprises:
a first electrode having first fingers that are parallel to one another;
a second electrode having second fingers that are parallel to one another and parallel to the first fingers;
wherein the second fingers of the second electrode are interdigitated with the first fingers of the first electrode; and
an insulator positioned between the first electrode and the second electrode.

7. The circuit of claim 6, wherein:
the first electrode is coupled to a supply potential; and
the second electrode is coupled to a reference potential.

8. The circuit of claim 6, wherein interdigitation of the first fingers and second fingers comprises interdigitations between portions of first and second fingers which extend in two orthogonal directions.

9. The circuit of claim 8, wherein the first fingers and second fingers are provided within a same metallization level.

10. The circuit of claim 8, wherein the first electrode and the second electrode form a planar structure, parallel to an upper surface of the substrate.

11. The circuit of claim 8, wherein the first fingers and the second fingers have a width equal to about 70 nm.

12. The circuit of claim 8, wherein the first fingers are separated from the second fingers by a distance of between about 70 nm to about 80 nm.

13. A digital integrated circuit, comprising:
a substrate;
first circuit cell areas of the substrate, wherein each first circuit cell area includes integrated circuitry for performing digital functions; and
second filler cell areas of the substrate located to fill space between first circuit cell areas, wherein each second filler cell area includes solely integrated circuitry for providing a filler capacitor;
a metallization level over said substrate, wherein the metallization level includes a further capacitor formed by an interdigitated metal-insulator-metal structure that is electrically coupled to said filler capacitor, said further capacitor aligned over at least one of said second filler cell areas and configured to increase a capacitance of the filler capacitor;
wherein the metallization level is one of a plurality of metallization levels, and further wherein the metallization level is positioned, of all metallization levels of said plurality of metallization levels, closest to an upper surface of said substrate.

14. The circuit of claim 13, wherein the interdigitated metal-insulator-metal structure comprises:
a first electrode having first fingers that are parallel to one another;
a second electrode having second fingers that are parallel to one another and parallel to the first fingers;
wherein the second fingers of the second electrode are interdigitated with the first fingers of the first electrode; and
an insulator positioned between the first electrode and the second electrode.

15. The circuit of claim 14, wherein the first fingers and second fingers are provided within a same metallization level.

16. The circuit of claim 14, wherein the first electrode and the second electrode form a planar structure, parallel to an upper surface of the substrate.

17. The circuit of claim 14, wherein interdigitation of the first fingers and second fingers comprises interdigitations between portions of first and second fingers which extend in two orthogonal directions.

18. The circuit of claim 14, wherein:
the first electrode is coupled to a supply potential; and
the second electrode is coupled to a reference potential.

19. The circuit of claim 14, wherein the first fingers and the second fingers have a width equal to about 70 nm.

20. The circuit of claim 14, wherein the first fingers are separated from the second fingers by a distance of between about 70 nm to about 80 nm.

21. A digital integrated circuit, comprising:
a substrate;
first circuit cell areas of the substrate, wherein each first circuit cell area includes integrated circuitry for performing digital functions; and
second filler cell areas of the substrate located to fill space between first circuit cell areas, wherein each second filler cell area includes solely integrated circuitry for providing a filler capacitor;
a metallization level over said substrate, wherein the metallization level includes a further capacitor formed by an interdigitated metal-insulator-metal structure that is electrically coupled to said filler capacitor, said further capacitor aligned over at least one of said second filler cell areas and configured to increase a capacitance of the filler capacitor;
wherein said filler capacitor is formed by:
- a first MOS transistor integrated in said substrate and having a first source and a first drain that are electrically connected to a first electrode of said further capacitor;
- a second MOS transistor integrated in said substrate and having a second source and a second drain that are electrically connected to a second electrode of said further capacitor; and
- wherein gates of the first and second MOS transistors are connected to each other.

22. The circuit of claim 21, wherein the first electrode of said further capacitor is coupled to a positive power supply node and wherein the second electrode of said further capacitor is coupled to a ground power supply node.

23. The circuit of claim 21, wherein the interdigitated metal-insulator-metal structure comprises:
- a first electrode having first fingers that are parallel to one another;
- a second electrode having second fingers that are parallel to one another and parallel to the first fingers;
- wherein the second fingers of the second electrode are interdigitated with the first fingers of the first electrode; and
- an insulator positioned between the first electrode and the second electrode.

24. The circuit of claim 23, wherein the first fingers and second fingers are provided within a same metallization level.

25. The circuit of claim 23, wherein the first electrode and the second electrode form a planar structure, parallel to an upper surface of the substrate.

26. The circuit of claim 23, wherein interdigitation of the first fingers and second fingers comprises interdigitations between portions of first and second fingers which extend in two orthogonal directions.

27. The circuit of claim 23, wherein:
the first electrode is coupled to a supply potential; and
the second electrode is coupled to a reference potential.

28. The circuit of claim 23, wherein the first fingers and the second fingers have a width equal to about 70 nm.

29. The circuit of claim 23, wherein the first fingers are separated from the second fingers by a distance of between about 70 nm to about 80 nm.

* * * * *